(12) United States Patent
Nam

(10) Patent No.: US 6,337,831 B1
(45) Date of Patent: Jan. 8, 2002

(54) WORD LINE DRIVING CIRCUIT FOR SEMICONDUCTOR MEMORY DEVICE

(75) Inventor: Ki Jun Nam, Seoul (KR)

(73) Assignee: Hyundai Electronics Industries Co., Ltd., Hyoungki-do (KR)

( * ) Notice: Subject to any disclaimer, the term of this patent is extended or adjusted under 35 U.S.C. 154(b) by 0 days.

(21) Appl. No.: 09/708,080

(22) Filed: Nov. 8, 2000

(30) Foreign Application Priority Data

Dec. 30, 1999 (KR) ............................................ 99/66269

(51) Int. Cl.[7] ................................................ G11C 8/00
(52) U.S. Cl. .............................. 365/230.06; 365/230.01
(58) Field of Search ........................ 365/230.06, 230.01

(56) References Cited

U.S. PATENT DOCUMENTS

| | | | |
|---|---|---|---|
| 5,305,279 A | 4/1994 | Park et al. | 365/230.03 |
| 5,781,498 A | 7/1998 | Suh | 365/230.06 |
| 6,195,305 B1 * | 2/2001 | Fujisawa et al. | 365/226 |

* cited by examiner

Primary Examiner—David Nelms
Assistant Examiner—M. Tran
(74) Attorney, Agent, or Firm—Birch, Stewart, Kolasch & Birch, LLP

(57) ABSTRACT

A hierarchical word line driving circuit for a semiconductor memory device can reduce a sub-threshold voltage leakage current because a sub-word line is disabled at a back bias voltage, overcome a layout penalty because an additional NMOS transistor for preventing the sub-word line from floating is not employed, and sufficiently obtain a line pitch passing above the sub-word line. The hierarchical word line driving circuit for the semiconductor memory device includes: a main word line driver including a transmission gate for selectively outputting a main word line signal, a selective latch unit for selectively latching and outputting the main word line signal selectively transmitted by the transmission gate, and a level shift unit for outputting an output from the selective latch unit or a back bias voltage according to a block selection signal and the main word line signal; and a sub-word line driver controlled according to an output from the main word line driver, for driving a sub-word line by using an inputted lower coding signal or a ground voltage.

12 Claims, 5 Drawing Sheets

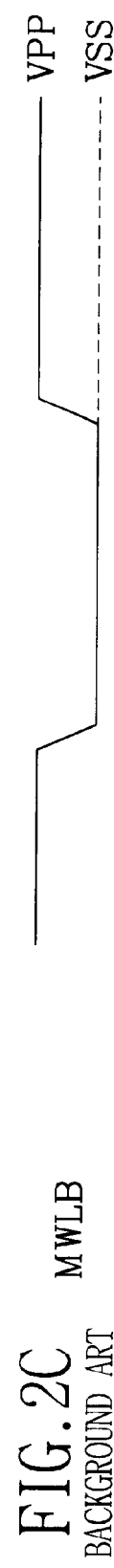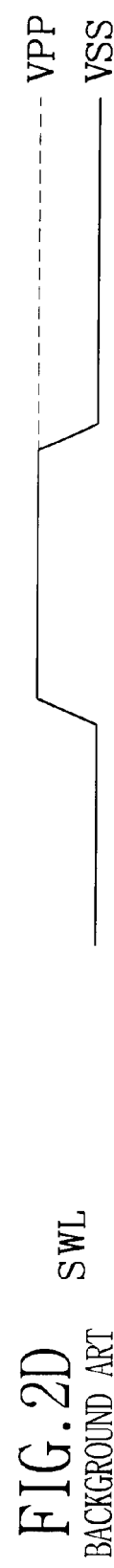
FIG. 2A BACKGROUND ART — SELECTED FXB
FIG. 2B BACKGROUND ART — NON-SELECTED FXB
FIG. 2C BACKGROUND ART — MWLB
FIG. 2D BACKGROUND ART — SWL

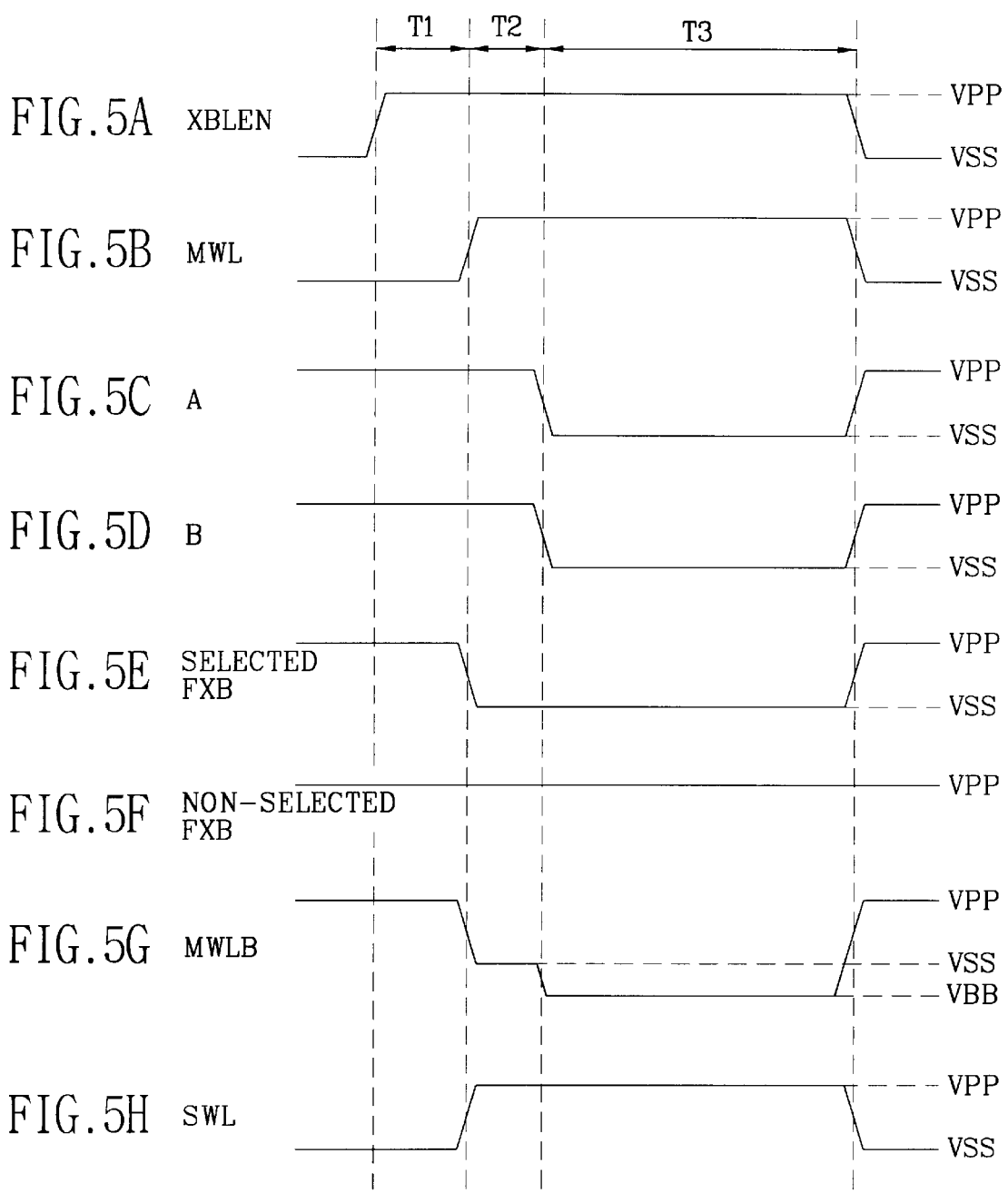

WORD LINE DRIVING CIRCUIT FOR SEMICONDUCTOR MEMORY DEVICE

BACKGROUND OF THE INVENTION

1. Field of the Invention

The present invention relates to a hierarchical word line driving circuit for a semiconductor memory device, and in particular to an improved hierarchical word line driving circuit for a semiconductor memory device which can reduce a sub-threshold voltage leakage current because a sub-word line is disabled at a back bias voltage, which can overcome a layout penalty because an additional NMOS transistor for preventing the sub-word line from floating is not employed, and which can sufficiently obtain a line pitch passing above the sub-word line.

2. Description of the Background Art

FIG. 1 is a circuit diagram illustrating a conventional hierarchical word line driving circuit for a semiconductor memory device. As shown therein, the conventional hierarchical word line driving circuit includes a main word line driver 1 and a sub-word line driver 2.

Here, the main word line driver 1 includes: a first PMOS transistor PM11 having its substrate commonly connected to its source to receive a driving voltage VPP; and a first NMOS transistor having its source connected to a ground voltage VSS, and having its substrate connected to receive a back bias voltage VBB, the first PMOS transistor PM11 and the first NMOS transistor NM11 being connected in series between the driving voltage VPP and the ground voltage VSS, having their gates commonly connected to a main word line, and having their drains commonly connected to output an output signal MWLB.

The sub-word line driver 2 includes: a first inverter INV11 inverting a lower coding signal FXB; a second PMOS transistor PM12 having its source connected to receive an inverted signal of the lower coding signal FXB by the first inverter INV11, and having its substrate connected to receive the driving voltage VPP; a second NMOS transistor NM12 having its source connected to the ground voltage VSS, and having its substrate connected to receive the back bias voltage VBB; and a third NMOS transistor NM13 having its source connected to the ground voltage VSS, and having its substrate connected to receive the back bias voltage VBB, the second PMOS transistor PM12 and the second NMOS transistor NM12 having their gates commonly connected to receive the output signal MLWB from the main word line driver 1, the second PMOS transistor PM12 and the second and third NMOS transistors NM12, NM13 having their commonly-connected drains connected to a sub-word line SWL.

Here, the driving voltage VPP is a word line voltage, and the back bias voltage VBB is operated as a well bias of a P-type substrate.

In addition, the main word line signal is a signal receiving upper coding.

The operation of the conventional hierarchical word line driving circuit for the semiconductor memory device will now be described in detail with reference to timing diagrams of FIG. 2.

When it is presumed that one block includes the 64 main word lines MWL controlled according to an upper coding signal, and it is also presumed that 8 lower coding signals FXB are generated, the 8 lower coding signals FXB are assigned to each main word line MWL, and thus total 512 sub-word lines exist in the block.

As illustrated in FIG. 2, in case the main word line MWL and the lower coding signal FXB are precharged with the driving voltage VPP at an initial stage, the driving voltage VPP is applied to the gate of the second NMOS transistor NM12. Accordingly, the sub-word line SWL is discharged to the ground voltage VSS. When the main word line MWL of the block selected by the upper coding signal is transited from the ground voltage VSS to the driving voltage VPP, as shown in FIG. 2(c), the output signal MWLB from the main word line driver 1 is transited from the driving voltage VPP to the ground voltage VSS, and applied to the gate of the second PMOS transistor PM12, thereby turning on the second PMOS transistor PM12.

Thereafter, when the lower coding signal FXB is transited from the driving voltage VPP to the ground voltage VSS, the driving voltage VPP is applied to the source of the second PMQS transistor PM12. At this time, since the gate of the second PMOS transistor PM12 has been already connected to the ground voltage VSS, a voltage between the gate and source of the second PMOS transistor PM12 becomes a minus driving voltage –VPP, and thus the second PMOS transistor PM12 is turned on.

Here, in a state where the output signal MWLB from the main word line driver 1 is enabled to the ground voltage VSS, when the selected lower coding signal FXB is enabled to the ground voltage VSS as shown in FIG. 2(a), the non-selected lower coding signal FXB is disabled to the driving voltage VPP as shown in FIG. 2(b) for preventing the sub-word line connected to the non-selected lower coding signal FXB from floating. As a result, the third NMOS transistor NM13 of the sub-word line driver 2 is turned on, and thus the sub-word line is connected to the ground voltage VSS through the third NMOS transistor NM13.

In the conventional sub-word line driver, when the output signal MWLB from the main word line driver is at a low level VSS and the lower coding signal FXB is at a high level VPP, the voltage between the gate and source of the second PMOS transistor becomes 0V, and thus the sub-word line floats. Accordingly, in order to overcome such a disadvantage, as soon as the lower coding signal FXB is transited to the driving voltage VPP, the non-selected sub-word line is connected to the ground voltage VSS by employing the third NMOS transistor. However, using the third NMOS transistor narrows the pitch of a metal line passing above the sub-word line driver, thus making it more difficult to design the layout. As a result, the layout area and costs of the chip are increased.

SUMMARY OF THE INVENTION

Accordingly, it is an object of the present invention to provide a word line driving circuit for a semiconductor memory device which can prevent a sub-word line from floating, without using an additional NMOS transistor.

In order to achieve the above-described object of the present invention, there is provided a word line driving circuit for a semiconductor memory device, including: a main word line driver consisting of a transmission gate for selectively outputting a main word line signal, a selective latch unit for selectively latching and outputting the main word line signal selectively transmitted by the transmission gate, and a level shift unit for outputting an output from the selective latch unit or a back bias voltage according to a block selection signal and the main word line signal; and a sub-word line driver controlled according to an output from the main word line driver, for driving a sub-word line by using an inputted lower coding signal or a ground voltage.

BRIEF DESCRIPTION OF THE DRAWINGS

The present invention will become better understood with reference to the accompanying drawings which are given only by way of illustration and thus are not limitative of the present invention, wherein:

FIGS. 2(a) to 2(d) are timing diagrams of the conventional word line driving circuit in FIG. 1, respectively;

FIGS. 5(a) to 5(h) are timing diagrams of the word line driving circuit as shown in FIG. 3.

DETAILED DESCRIPTION OF THE PREFERRED EMBODIMENTS

A word line driving circuit for a semiconductor memory device in accordance with a preferable embodiment of the present invention will now be described in detail with reference to the accompanying drawings.

Figure 1:
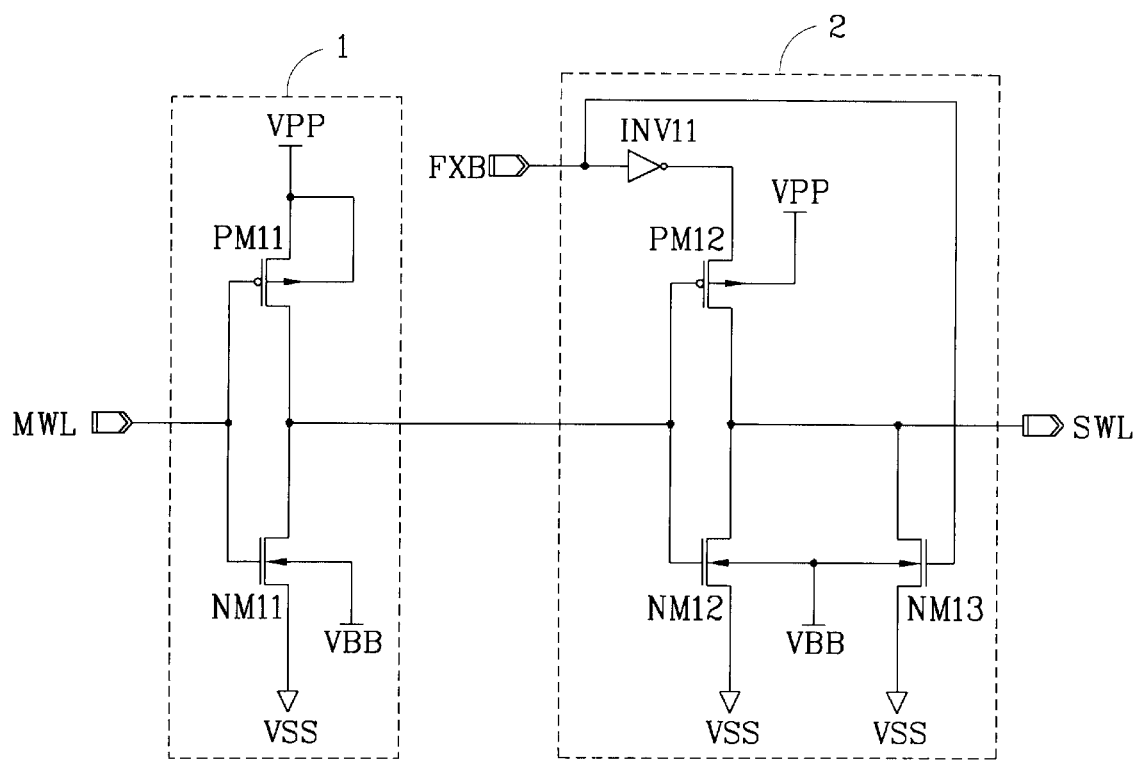
FIG. 1 is a block diagram illustrating a conventional word line driving circuit for a semiconductor memory device.
Figure 3:
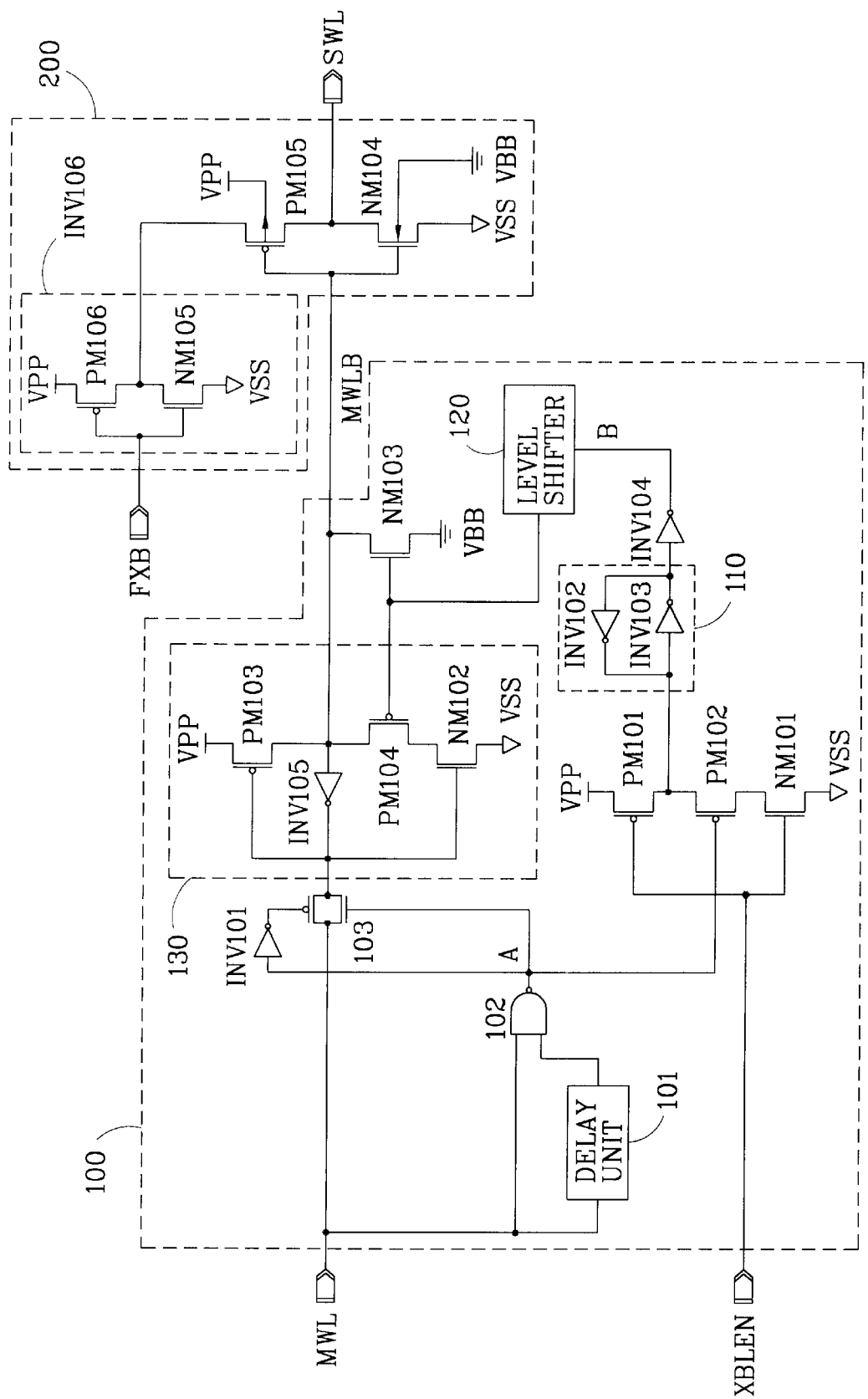
FIG. 3 is a block diagram illustrating a word line driving circuit for a semiconductor memory device in accordance with the present invention.

FIG. 3 is a circuit diagram illustrating the hierarchical word line driving circuit for the semiconductor memory device in accordance with the present invention. As shown therein, the hierarchical word line driving circuit includes a main word line driver 100 and a sub-word line driver 200.

Here, the main word line driver 100 includes: a delay unit 101 for delaying a main word line signal MWL; a NAND gate 102 for NANDing an output from the delay unit 101 and the main word line signal MWL; a first inverter INV101 for inverting an output A from the NAND gate 102; a transmission gate 103 controlled according to the output A from the NAND gate 102 and an output from the first inverter INV101, for selectively outputting the main word line signal MWL; a first PMOS transistor PM101 having its gate connected to receive a block selection signal XBLEN; a second PMOS transistor PM102 having its gate connected to receive the output from the NAND gate 102; a first NMOS transistor NM101 having its gate connected to receive the block selection signal XBLEN, the first and second PMOS transistors PM101, PM102 and the first NMOS transistor NM101 being connected in series between a driving voltage VPP and a ground voltage VSS; a latch unit 110 consisting of second and third inverters INV102, INV103 having their input terminals connected to receive their outputs each other in order to latch a voltage from a node formed by a drain of the first PMOS transistor PM101 and a source of the second PMOS transistor PM102 which are commonly connected; a fourth inverter INV104 for inverting an output from the latch unit 110; a level shifter 120 for level shifting an output B inputted from the fourth inverter INV104 with the driving voltage VPP or back bias voltage VBB; a selective latch unit 130 for performing a selective latching operation according to an output from the level shifter 120; and a third NMOS transistor NM103 having its gate connected to receive an output from the level shifter 120, having its source connected to receive the back bias voltage VBB, and having its drain connected to an output terminal of the selective latch unit 130, the drain of the third NMOS transistor NM103 and the output terminal of the selective latch unit 130 which are commonly connected outputting an output signal MWLB.

Here, the selective latch unit 130 includes: a third PMOS transistor PM103 having its gate connected to receive the main word line signal MWL selectively outputted by the transmission gate 103; a fourth PMOS transistor PM104 having its gate connected to receive the output from the level shifter 120; a second NMOS transistor NM102 having its gate connected to receive the main word line signal MWL selectively outputted by the transmission gate 103, the third and fourth PMOS transistors PM103, PM104 and the second NMOS transistor NM102 being connected in series between the driving voltage VPP and the ground voltage VSS; and a fifth inverter INV105 for inverting a voltage from a node formed by a drain of the third PMOS transistor PM103 and a source of the fourth PMOS transistor PM104 which are commonly connected, and for applying the inverted voltage to the gates of the third PMOS transistor PM103 and the second NMOS transistor NM102.

In addition, the sub-word line driver 200 includes: a sixth inverter INV106 consisting of a sixth PMOS transistor PM106 and a fifth NMOS transistor NM105 connected in series between the driving voltage VPP and the ground voltage VSS to invert the lower coding signal FXB, having their gates commonly connected to form an input terminal and receive the lower coding signal FXB, and having their drains commonly connected to form an output terminal; a fifth PMOS transistor PM105 having its source connected to receive an inverted signal of the lower coding signal FXB by the sixth inverter INV106, and having its substrate connected to receive the driving voltage VPP; and a fourth NMOS transistor NM104 having its drain connected to the drain of the fifth PMOS transistor PM105, having its source connected to the ground voltage VSS, and having its substrate connected to receive the back bias voltage VBB, the fifth PMOS transistor PM105 and the fourth NMOS transistor NM104 having their gates commonly connected to receive the output signal MWLB from the main word line driver 100, the commonly-connected drains of the fifth PMOS transistor PM105 and the fourth NMOS transistor NM104 forming an output terminal connected to the sub-word line SWL.

Figure 4:
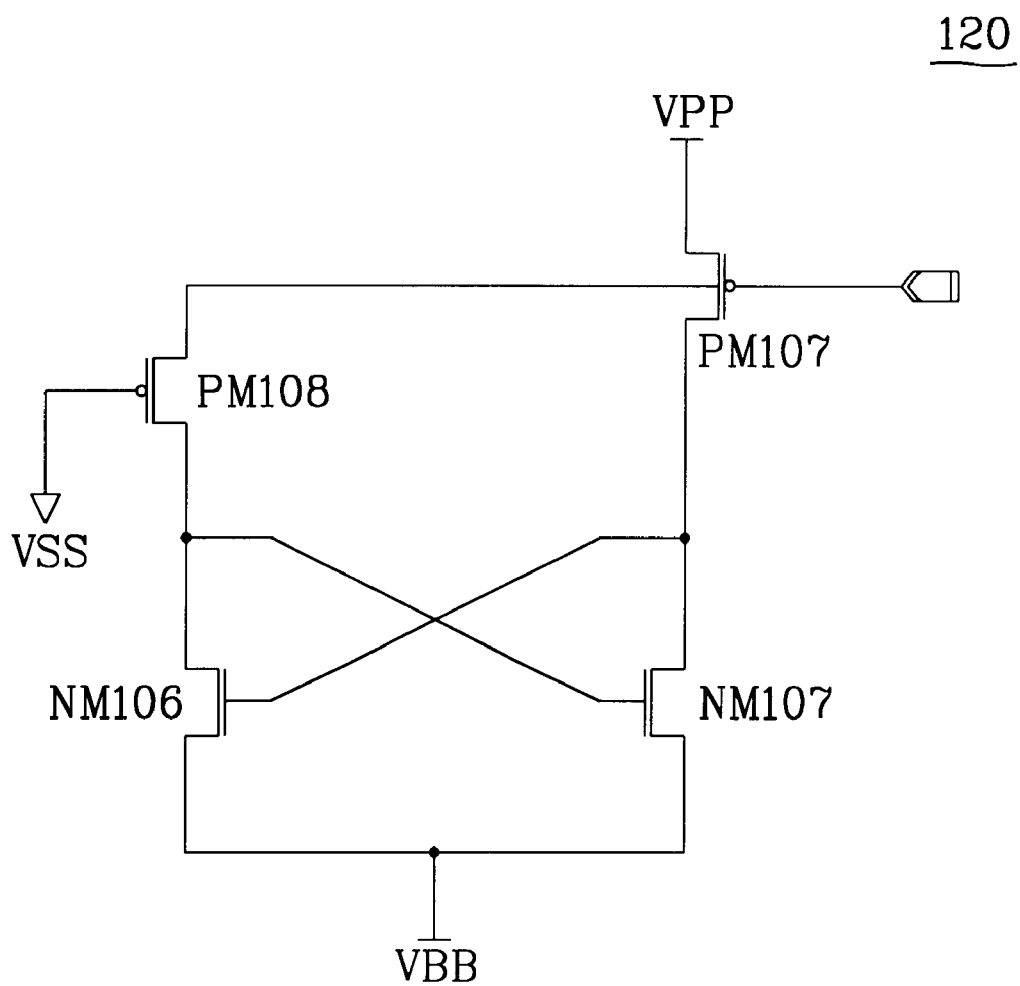
FIG. 4 is a detailed circuit diagram illustrating a level shifter of a main word line driver as shown in FIG. 3.

FIG. 4 is a detailed circuit diagram illustrating the level shifter 120 of the main word line driver 100. As shown therein, the level shifter 120 includes: a seventh PMOS transistor PM107 having its source connected to receive the driving voltage VPP, and having its gate connected to receive the output from the fourth inverter INV104; an eighth PMOS transistor PM108 having its source connected to receive the output from the fourth inverter INV104, and having its gate connected to the ground voltage VSS; a sixth NMOS transistor NM106 having its drain connected to the drain of the eighth PMOS transistor PM108, having its gate connected to the drain of the seventh PMOS transistor PM107, and having its source connected to receive the back bias voltage VBB; and a seventh NMOS transistor NM107 having its drain connected to the drain of the seventh PMOS transistor PM107, having its gate connected to the drain of the eighth PMOS transistor PM108, and having its source connected to receive the back bias voltage VBB, the drain of the seventh PMOS transistor PM107, the drain of the seventh NMOS transistor NM107 and the sixth NMOS transistor NM106 which are commonly connected forming an output terminal to output an output signal OUT.

The operation of the word line driving circuit for the semiconductor memory device in accordance with the present invention will now be described in detail.

As illustrated in FIG. 5, the block selection signal XBLEN is transited from a low level VSS to a high level VPP in a first period T1, thereby selecting a wanted block. Here, the main word line signal MWL is at a low level VSS, and the output A from the NAND gate 102 becomes a high level VPP. Accordingly, the transmission gate TG101 is turned on, and thus the main word line signal MWL is transmitted.

At this time, the output B from the fourth inverter INV104 is at a high level VPP, and thus the fourth PMOS transistor PM104 of the selective latch unit 130 is turned on by the level shifter 120. Therefore, the selective latch unit 130 performs a latch operation. Here, the main word line signal MWL is at a low level VSS, and thus the third PMOS transistor PM103 of the selective latch unit 130 is turned on, thereby outputting the output signal MWLB of the main word line driver 100 at a high level VPP.

Accordingly, the fourth NMOS transistor NM104 of the sub-word line driver 200 is turned on, and thus the sub-word line SWL is connected to the ground VSS through the fourth NMOS transistor NM104. Therefore, the sub-word line SWL becomes a low level VSS.

Thereafter, in a second period T2 of FIG. 5, the output A from the NAND gate 102 is at a high level VPP, and thus the transmission gate 103 is turned on. In addition, the output B from the fourth inverter INV104 is at a high level VPP, and thus the fourth PMOS transistor PM104 is turned on. Accordingly, the selective latch unit 130 performs a latch operation. At this time, the main word line signal MWL is transited to a high level VPP, and thus the second NMOS transistor NM102 of the selective latch unit 130 is turned on, thereby outputting the output signal MWLB of the main word line driver 100 at a low level VSS.

As a result, the fifth PMOS transistor PM105 of the sub-word line driver 120 is turned on. Here, the selected lower coding signal FXB is at a low level VSS, and thus the sixth PMOS transistor PM106 of the fourth inverter INV104 is turned on. Accordingly, the sub-word line SWL becomes a high level VPP.

On the other hand, the non-selected lower coding signal FXB maintains a high level VPP, and thus the fifth NMOS transistor NM105 of the sixth inverter INV106 is turned on. The non-selected sub-word line SWL is connected to the ground voltage VSS, which prevents the non-selected sub-word line SWL from floating.

Here, the output signal MWLB of the main word line driver 100 is transited just after the selected lower coding signal FXB is transited, thereby preventing the sub-word line SWL from temporarily floating.

In a third period T3 of FIG. 5, the output A from the NAND gate 102 becomes a low level VSS, and thus the transmission gate TG101 is turned off. In addition, the second PMOS transistor PM102 is turned on, and thus the output from the fourth inverter INV104 becomes a low level VSS. Accordingly, the third NMOS transistor NM103 is turned on by the output from the level shifter 120, thereby outputting the output signal MWLB of the main word line driver 100 at a low level VBB. As a result, the fifth PMOS transistor PM105 of the sub-word line driver 200 is constantly turned on. Here, the selected lower coding signal FXB constantly maintains a low level VSS, and thus the sixth PMOS transistor PM106 of the fifth inverter INV105 is constantly turned on, thereby maintaining the sub-word line at a high level VPP.

Here, the level shifter 120 outputs the driving voltage VPP when the output B from the fourth inverter INV104 is at a low level VSS, and outputs the back bias voltage VBB when the output B is at a high level VPP.

On the other hand, the block selection signal XBLEN and the main word line signal MWL are transited to a low level VSS at an end of the third period T3 of the FIG. 5. Accordingly, the output A from the NAND gate 102, the output B from the fourth inverter INV104 and the output MWLB from the main word line driver 100 are transited to a high level VPP, and thus the sub-word line SWL is transited to a low level VSS.

As illustrated in FIG. 5(g), the non-selected lower coding signal FXB constantly maintains a high level, and thus the non-selected sub-word line SWL is connected to the ground voltage VSS through the fifth NMOS transistor NM105 of the fifth inverter INV105. As a result, it prevents the non-selected sub-word line SWL from floating.

In addition, the output signal MWLB from the main word line driver 100 is firstly transited from the driving voltage VPP to the ground voltage VSS, and then transited to the back bias voltage VBB. It prevents the instantaneous power consumption by a great level difference and the current inflow from the driving voltage VPP to the back bias voltage VBB in the case that the output signal MWLB is directly transited from the driving voltage VPP to the back bias voltage VBB.

The inverted main word line signal for driving the sub-word line driver is firstly transited from the driving voltage to the ground voltage, and then transited to the back bias voltage, thereby reducing the current which instantaneously flows. Additionally, the sub-threshold voltage leakage current flowing through the NMOS transistor of the sub-word line driver may be decreased by using the back bias voltage.

Furthermore, the additional NMOS transistor composing the conventional sub-word line driver for preventing the sub-word line from floating is not employed, thereby reducing a layout overhead and sufficiently obtaining the line pitch above the line sub-word line driver.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. In a semiconductor memory device using a hierarchical word line driving circuit, the hierarchical word line driving circuit comprising:

a main word line driver including a transmission gate for selectively outputting a main word line signal, a selective latch unit for selectively latching and outputting the main word line signal selectively transmitted by the transmission gate, and a level shift unit for outputting an output from the selective latch unit or a back bias voltage according to a block selection signal and the main word line signal; and a sub-word line driver controlled according to an output from the main word line driver, for driving a sub-word line by using an inputted lower coding signal or a ground voltage.

2. The circuit according to claim 1, wherein the transmission gate is controlled according to an output from a pulse generator and an inverted signal thereof.

3. The circuit according to claim 2, wherein the pulse generator comprises:

a delay for delaying the main word line signal for a predetermined time; and a NAND gate for NANDing the main word line signal and an output from the delay.

4. The circuit according to claim 1, wherein the level shift unit comprises:
- a first PMOS transistor and a first NMOS transistor having their gates commonly connected to receive a block selection signal;
- a second PMOS transistor having its gate connected to receive an output from the pulse generator, the first and second PMOS transistors and the first NMOS transistor being connected in series between the driving voltage and the ground voltage;
- a latch unit for latching a voltage from a node formed by a drain of the first PMOS transistor and a source of the second PMOS transistor which are commonly connected;
- a first inverter for inverting an output from the latch unit;
- a level shifter for receiving an output from the first inverter, and outputting the driving voltage or back bias voltage; and
- a second NMOS transistor having its gate connected to receive an output from the level shifter, having its source connected to receive the back bias voltage, and having its drain connected to the output terminal of the main word line driver.

5. The circuit according to claim 1, wherein the selective latch unit comprises:
- a third PMOS transistor and a third NMOS transistor having their gates commonly connected to receive the main word line signal selectively outputted by the transmission gate;
- a fourth PMOS transistor having its gate connected to receive the output from the level shifter of the level shift unit, the third and fourth PMOS transistors and the third NMOS transistor being connected in series between the driving voltage and the ground voltage; and
- a second inverter for inverting a voltage from a node formed by a drain of the third PMOS transistor and a source of the fourth PMOS transistor which are commonly connected, and for applying the inverted voltage to the commonly-connected gates of the third PMOS transistor and the third NMOS transistor, the drain of the third PMOS transistor and the source of the fourth PMOS transistor forming an output terminal.

6. The circuit according to claim 4, wherein the level shifter comprises:
- a fifth PMOS transistor having its source connected to receive the driving voltage, and having its gate connected to receive the output from the first inverter;
- a sixth PMOS transistor having its source connected to receive the output from the first inverter, and having its gate connected to the ground voltage;
- a fourth NMOS transistor having its gate connected to the drain of the fifth PMOS transistor, and having its drain connected to the drain of the sixth PMOS transistor; and
- a fifth NMOS transistor having its gate connected to the drain of the sixth PMOS transistor, and having its drain connected to the drain of the fifth PMOS transistor, the fourth and fifth NMOS transistors having their sources commonly connected to receive the back bias voltage VBB, the drain of the fifth PMOS transistor, the drain of the fifth NMOS transistor and the gate of the fourth NMOS transistor which are commonly connected forming an output terminal.

7. The circuit according to claim 1, wherein the sub-word line driver comprises:
- a third inverter for inverting the lower coding signal;
- a seventh PMOS transistor having its source connected to receive an output from the third inverter, and having its substrate connected to receive the driving voltage; and
- a sixth NMOS transistor having its source connected to the ground voltage, and having its substrate connected to receive the back bias voltage, the seventh PMOS transistor and the sixth NMOS transistor having their gates commonly connected to receive the output from the main word line driver, the commonly-connected drains of which forming an output terminal connected to a sub-word line.

8. The circuit according to claim 7, wherein the third inverter comprises: an eighth PMOS transistor and a seventh NMOS transistor being connected in series between the driving voltage and the ground voltage, and having their gates commonly connected to receive the lower coding signal, the commonly-connected drains of which forming an output terminal.

9. The circuit according to claim 1 or 3, wherein the main word line signal is a signal for receiving upper coding.

10. The circuit according to claim 1 or 4, wherein the block selection signal is a signal for receiving more upper coding than the main word line signal.

11. The circuit according to claim 4, 5, 6, 7 or 8, wherein the driving signal is a word line voltage.

12. The circuit according to claim 4, 6 or 7, wherein the back bias voltage functions as a well bias of a P-type substrate.

* * * * *